US009318862B2

(12) United States Patent
Rathburn

(10) Patent No.: US 9,318,862 B2
(45) Date of Patent: Apr. 19, 2016

(54) METHOD OF MAKING AN ELECTRONIC INTERCONNECT

(71) Applicant: HSIO TECHNOLOGIES, LLC, Maple Grove, MN (US)

(72) Inventor: Jim Rathburn, Maple Grove, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 227 days.

(21) Appl. No.: 14/254,038

(22) Filed: Apr. 16, 2014

(65) Prior Publication Data

US 2014/0220797 A1 Aug. 7, 2014

Related U.S. Application Data

(63) Continuation-in-part of application No. 13/320,285, filed as application No. PCT/US2010/036282 on May 27, 2010, application No. 14/254,038, which is a continuation-in-part of application No. 13/318,369, (Continued)

(51) Int. Cl.
*H05K 3/00* (2006.01)
*H05K 3/02* (2006.01)

(Continued)

(52) U.S. Cl.
CPC .............. *H01R 43/18* (2013.01); *H01R 12/714* (2013.01); *H01R 13/2442* (2013.01); *H01R 13/193* (2013.01); *H01R 13/4361* (2013.01); *Y10T 29/49155* (2015.01)

(58) Field of Classification Search
CPC ................. H01R 12/714; H01R 12/62; H05K 2201/1059; Y10T 29/49155; Y10T 29/49147; Y10T 29/5193; B05C 5/0245; B05C 5/0254; B05C 5/027
USPC ........... 29/846, 825, 829, 852, 874, 876, 877; 439/65, 66, 70, 81, 91, 620.22
See application file for complete search history.

(56) References Cited

U.S. PATENT DOCUMENTS 3,672,986 A 6/1972 Schneble, Jr. et al.
4,188,438 A 2/1980 Burns (Continued)

FOREIGN PATENT DOCUMENTS

JP 2003/217774 7/2003
WO WO 91/14015 9/1991

(Continued)

OTHER PUBLICATIONS

Final Office Action mailed May 15, 2014 in co-pending U.S. Appl. No. 13/266,486, now published as US Patent Application Publication No. US 2012/0055701.

(Continued)

*Primary Examiner* — Thiem Phan

(57) ABSTRACT

An electrical interconnect including a substrate with at least two adjacent layers configured to translate relative to each other between a nominal position and a translated position. A plurality of through holes are formed through the layers from a first surface of the substrate to a second surface of the substrate in both the nominal position and the translated position. At least one contact member is positioned in the through holes with distal portions accessible from the first surface and a proximal portions positioned near the second surface. The proximal portion of the contact members are secured to the substrate near the second surface with a conductive structure. The two adjacent layers of the substrate are translated from the nominal position to the translated position to elastically deform the contact members within the through holes and to displace the distal portions of the contact members toward the conductive structures, respectively.

10 Claims, 8 Drawing Sheets

Related U.S. Application Data filed as application No. PCT/US2010/036295 on May 27, 2010, now Pat. No. 9,277,654, application No. 14/254,038, which is a continuation-in-part of application No. 13/319,158, filed as application No. PCT/US2010/038606 on Jun. 15, 2010, application No. 14/254,038, which is a continuation-in-part of application No. 14/238,638, filed as application No. PCT/US2012/053848 on Sep. 6, 2012.

(60) Provisional application No. 61/812,455, filed on Apr. 16, 2013, provisional application No. 61/183,340, filed on Jun. 2, 2009, provisional application No. 61/183,324, filed on Jun. 2, 2009, provisional application No. 61/187,873, filed on Jun. 17, 2009, provisional application No. 61/532,379, filed on Sep. 8, 2011.

(51) Int. Cl.

| | |
|---|---|
| ***H01R 43/18*** | (2006.01) |
| ***H01R 12/71*** | (2011.01) |
| ***H01R 13/24*** | (2006.01) |
| *H01R 13/193* | (2006.01) |
| *H01R 13/436* | (2006.01) |

(56) References Cited

U.S. PATENT DOCUMENTS 4,295,700 A 10/1981 Sado
4,489,999 A 12/1984 Miniet
4,922,376 A 5/1990 Pommer et al.
4,964,948 A 10/1990 Reed
5,014,159 A 5/1991 Butt
5,071,363 A 12/1991 Reylek et al.
5,072,520 A 12/1991 Nelson
5,096,426 A 3/1992 Simpson et al.
5,127,837 A 7/1992 Shah et al.
5,129,573 A 7/1992 Duffey
5,161,983 A 11/1992 Ohno
5,167,512 A 12/1992 Walkup
5,208,068 A 5/1993 Davis et al.
5,237,203 A 8/1993 Massaron
5,246,880 A 9/1993 Reele et al.
5,286,680 A 2/1994 Cain
5,334,029 A 8/1994 Akkapeddi et al.
5,358,621 A 10/1994 Oyama
5,378,981 A 1/1995 Higgins, III
5,419,038 A 5/1995 Wang et al.
5,454,161 A 10/1995 Beilin et al.
5,479,319 A 12/1995 Werther et al.
5,509,019 A 4/1996 Yamamura
5,527,998 A 6/1996 Anderson et al.
5,562,462 A 10/1996 Matsuba et al.
5,659,181 A 8/1997 Bridenbaugh
5,674,595 A 10/1997 Busacco et al.
5,691,041 A 11/1997 Frankeny et al.
5,716,663 A 2/1998 Capote et al.
5,741,624 A 4/1998 Jeng et al.
5,746,608 A 5/1998 Taylor
5,761,801 A 6/1998 Gebhardt et al.
5,764,485 A 6/1998 Lebaschi
5,772,451 A 6/1998 Dozler et al.
5,785,538 A 7/1998 Beaman et al.
5,787,976 A 8/1998 Hamburgen et al.
5,802,699 A 9/1998 Fjelstad et al.
5,802,711 A 9/1998 Card et al.
5,819,579 A 10/1998 Roberts
5,904,546 A 5/1999 Wood et al.
5,913,109 A 6/1999 Distefano et al.
5,921,786 A 7/1999 Slocum et al.
5,925,931 A 7/1999 Yamamoto
5,933,558 A 8/1999 Sauvageau et al.
5,973,394 A 10/1999 Slocum et al.
6,020,597 A 2/2000 Kwak
6,062,879 A 5/2000 Beaman et al.
6,080,932 A 6/2000 Smith et al.
6,107,109 A 8/2000 Akram et al.
6,114,240 A 9/2000 Akram et al.
6,118,426 A 9/2000 Albert
6,120,588 A 9/2000 Jacobson
6,137,687 A 10/2000 Shirai et al.
6,172,879 B1 1/2001 Cilia et al.
6,177,921 B1 1/2001 Comiskey
6,178,540 B1 1/2001 Lo et al.
6,181,144 B1 1/2001 Hembree et al.
6,200,143 B1 3/2001 Haba et al.
6,207,259 B1 3/2001 Iino et al.
6,225,692 B1 5/2001 Hinds
6,247,938 B1 6/2001 Rathburn
6,252,564 B1 6/2001 Albert
6,255,126 B1 7/2001 Mathieu et al.
6,263,566 B1 7/2001 Hembree et al.
6,270,363 B1 8/2001 Brofman et al.
6,288,451 B1 9/2001 Tsao
6,312,971 B1 11/2001 Amundson
6,313,528 B1 11/2001 Solberg
6,320,256 B1 11/2001 Ho
6,350,386 B1 2/2002 Lin
6,359,790 B1 3/2002 Meyer-Berg
6,413,790 B1 7/2002 Duthaler
6,422,687 B1 7/2002 Jacobson
6,428,328 B2 8/2002 Haba et al.
6,437,452 B2 8/2002 Lin
6,437,591 B1 8/2002 Farnworth et al.
6,459,418 B1 10/2002 Comiskey
6,461,183 B1 10/2002 Ohkita
6,462,418 B2 10/2002 Sakamoto et al.
6,462,568 B1 10/2002 Cram
6,477,286 B1 11/2002 Ouchi
6,490,786 B2 12/2002 Belke et al.
6,494,725 B2 12/2002 Lin et al.
6,506,438 B2 1/2003 Duthaler et al.
6,521,489 B2 2/2003 Duthaler
6,545,291 B1 4/2003 Amundson
6,572,396 B1 6/2003 Rathburn
6,574,114 B1 6/2003 Brindle et al.
6,593,535 B2 7/2003 Gailus
6,603,080 B2 8/2003 Jensen
6,614,104 B2 9/2003 Farnworth et al.
6,626,526 B2 9/2003 Ueki
6,639,578 B1 10/2003 Comiskey
6,642,127 B2 11/2003 Kumar et al.
6,652,075 B2 11/2003 Jacobson
6,661,084 B1 12/2003 Peterson et al.
6,662,442 B1 12/2003 Matsui et al.
6,709,967 B2 3/2004 Evers
6,744,126 B1 6/2004 Chiang
6,750,473 B2 6/2004 Amundson
6,758,691 B1 7/2004 McHugh
6,773,302 B2 8/2004 Gutierrez et al.
6,800,169 B2 10/2004 Liu et al.
6,809,414 B1 10/2004 Lin et al.
6,821,131 B2 11/2004 Suzuki et al.
6,823,124 B1 11/2004 Renn
6,825,829 B1 11/2004 Albert
6,827,611 B1 12/2004 Payne et al.
6,830,460 B1 12/2004 Rathburn
6,840,777 B2 1/2005 Sathe et al.
6,853,087 B2 2/2005 Neuhaus et al.
6,856,151 B1 2/2005 Cram
6,861,345 B2 3/2005 Ball et al.
6,910,897 B2 6/2005 Driscoll et al.
6,946,325 B2 9/2005 Yean et al.
6,962,829 B2 11/2005 Glenn et al.
6,965,168 B2 11/2005 Langhorn
6,967,640 B2 11/2005 Albert
6,971,902 B2 12/2005 Taylor
6,987,661 B1 1/2006 Huemoeller et al.
6,992,376 B2 1/2006 Jaeck
7,009,413 B1 3/2006 Alghouli
7,025,600 B2 4/2006 Higashi
7,029,289 B2 4/2006 Li
7,040,902 B2 5/2006 Li

(56) References Cited

U.S. PATENT DOCUMENTS 7,045,015 B2 5/2006 Renn
7,064,412 B2 6/2006 Geissinger et al.
7,070,419 B2 7/2006 Brown et al.
7,095,090 B2 8/2006 Nakajiman et al.
7,101,210 B2 9/2006 Lin
7,114,960 B2 10/2006 Rathburn
7,118,391 B2 10/2006 Minich et al.
7,121,837 B2 10/2006 Sato et al.
7,121,839 B2 10/2006 Rathburn
7,129,166 B2 10/2006 Speakman
7,138,328 B2 11/2006 Downey et al.
7,145,228 B2 12/2006 Yean et al.
7,148,128 B2 12/2006 Jacobson
7,154,175 B2 12/2006 Shrivastava et al.
7,157,799 B2 1/2007 Noquil et al.
7,180,313 B2 2/2007 Bucksch
7,217,996 B2 5/2007 Cheng et al.
7,220,287 B1 5/2007 Wyrzykowska et al.
7,229,293 B2 6/2007 Sakurai et al.
7,232,263 B2 6/2007 Sashinaka et al.
7,244,967 B2 7/2007 Hundt et al.
7,249,954 B2 7/2007 Weiss
7,276,919 B1 10/2007 Beaman et al.
7,301,105 B2 11/2007 Vasoya
7,321,168 B2 1/2008 Tao
7,326,064 B2 2/2008 Rathburn
7,327,006 B2 2/2008 Svard et al.
7,337,537 B1 3/2008 Smetana, Jr.
7,382,363 B2 6/2008 Albert et al.
7,402,515 B2 7/2008 Arana et al.
7,410,825 B2 8/2008 Majumdar et al.
7,411,304 B2 8/2008 Kirby et al.
7,417,299 B2 8/2008 Hu
7,417,314 B1 8/2008 Lin et al.
7,423,219 B2 9/2008 Kawaguchi et al.
7,427,717 B2 9/2008 Morimoto et al.
7,432,600 B2 10/2008 Klein et al.
7,458,150 B2 12/2008 Totokawa et al.
7,459,393 B2 12/2008 Farnworth et al.
7,485,345 B2 2/2009 Renn
7,489,524 B2 2/2009 Green et al.
7,508,076 B2 3/2009 Japp et al.
7,527,502 B2 5/2009 Li
7,531,906 B2 5/2009 Lee
7,536,714 B2 5/2009 Yuan
7,537,461 B2 5/2009 Rathburn
7,538,415 B1 5/2009 Lin et al.
7,563,645 B2 7/2009 Jaeck
7,595,454 B2 9/2009 Kresge et al.
7,619,309 B2 11/2009 Drexl et al.
7,621,761 B2 11/2009 Mok et al.
7,628,617 B2 12/2009 Brown et al.
7,632,106 B2 12/2009 Nakamura
7,645,635 B2 1/2010 Wood et al.
7,651,382 B2 1/2010 Yasumura et al.
7,658,163 B2 2/2010 Renn
7,674,671 B2 3/2010 Renn
7,726,984 B2 6/2010 Bumb et al.
7,736,152 B2 6/2010 Hougham et al.
7,748,110 B2 7/2010 Asahi et al.
7,758,351 B2 7/2010 Brown et al.
7,800,916 B2 9/2010 Blackwell et al.
7,833,832 B2 11/2010 Wood et al.
7,836,587 B2 11/2010 Kim
7,868,469 B2 1/2011 Mizoguchi
7,874,847 B2 1/2011 Matsui et al.
7,897,503 B2 3/2011 Foster et al.
7,898,087 B2 3/2011 Chainer
7,955,088 B2 6/2011 Di Stefano
7,999,369 B2 8/2011 Malhan et al.
8,044,502 B2 10/2011 Rathburn
8,058,558 B2 11/2011 Mok et al.
8,072,058 B2 12/2011 Kim et al.
8,114,687 B2 2/2012 Mizoguchi
8,120,173 B2 2/2012 Forman et al.
8,148,643 B2 4/2012 Hirose et al.
8,154,119 B2 4/2012 Yoon et al.
8,158,503 B2 4/2012 Abe
8,159,824 B2 4/2012 Cho et al.
8,178,978 B2 5/2012 McElrea et al.
8,203,207 B2 6/2012 Getz et al.
8,227,703 B2 7/2012 Maruyama et al.
8,232,632 B2 7/2012 Rathburn
8,247,702 B2 8/2012 Kouya
8,278,141 B2 10/2012 Chow et al.
8,299,494 B2 10/2012 Yilmaz et al.
8,329,581 B2 12/2012 Haba et al.
8,344,516 B2 1/2013 Chainer
8,373,428 B2 2/2013 Eldridge et al.
8,421,151 B2 4/2013 Yamashita
8,525,322 B1 9/2013 Kim et al.
8,525,346 B2 9/2013 Rathburn
8,536,714 B2 9/2013 Sakaguchi
8,536,889 B2 9/2013 Nelson et al.
8,610,265 B2 12/2013 Rathburn
8,618,649 B2 12/2013 Rathburn
8,758,067 B2 6/2014 Rathburn
8,789,272 B2 7/2014 Rathburn
8,803,539 B2 8/2014 Rathburn
8,829,671 B2 9/2014 Rathburn
8,912,812 B2 12/2014 Rathburn
8,928,344 B2 1/2015 Rathburn
8,955,215 B2 2/2015 Rathburn
8,955,216 B2 2/2015 Rathburn
8,970,031 B2 3/2015 Rathburn
8,981,568 B2 3/2015 Rathburn
8,981,809 B2 3/2015 Rathburn
8,984,748 B2 3/2015 Rathburn
8,987,886 B2 3/2015 Rathburn
8,988,093 B2 3/2015 Rathburn
2001/0012707 A1 8/2001 Ho et al.
2001/0016551 A1 8/2001 Yushio et al.
2002/0011639 A1 1/2002 Carlson et al.
2002/0027441 A1 3/2002 Akram et al.
2002/0062200 A1 5/2002 Mori et al.
2002/0079912 A1 6/2002 Shahriari et al.
2002/0088116 A1 7/2002 Milkovich et al.
2002/0098740 A1 7/2002 Ooya
2002/0105080 A1 8/2002 Speakman
2002/0105087 A1 8/2002 Forbes et al.
2002/0160103 A1 10/2002 Fukunaga et al.
2003/0003779 A1 1/2003 Rathburn
2003/0096512 A1 5/2003 Cornell
2003/0114029 A1 6/2003 Lee et al.
2003/0117161 A1 6/2003 Burns
2003/0156400 A1 8/2003 Dibene et al.
2003/0162418 A1 8/2003 Yamada
2003/0164548 A1 9/2003 Lee
2003/0188890 A1 10/2003 Bhatt et al.
2003/0189083 A1 10/2003 Olsen
2003/0231819 A1 12/2003 Palmer et al.
2004/0016995 A1 1/2004 Kuo et al.
2004/0029411 A1 2/2004 Rathburn
2004/0048523 A1 3/2004 Huang et al.
2004/0054031 A1 3/2004 Jacobson
2004/0070042 A1 4/2004 Lee et al.
2004/0077190 A1 4/2004 Huang et al.
2004/0174180 A1 9/2004 Fukushima et al.
2004/0183557 A1 9/2004 Akram
2004/0184219 A1 9/2004 Otsuka et al.
2004/0217473 A1 11/2004 Shen
2004/0243348 A1 12/2004 Minatani
2005/0020116 A1 1/2005 Kawazoe et al.
2005/0048680 A1 3/2005 Matsunami
2005/0100294 A1 5/2005 Nguyen et al.
2005/0101164 A1 5/2005 Rathburn
2005/0162176 A1 7/2005 Bucksch
2005/0164527 A1 7/2005 Radza et al.
2005/0196511 A1 9/2005 Garrity et al.
2005/0253610 A1 11/2005 Cram
2006/0001152 A1 1/2006 Hu
2006/0006534 A1 1/2006 Yean et al.
2006/0012966 A1 1/2006 Chakravorty
2006/0024924 A1 2/2006 Haji et al.

(56) References Cited

U.S. PATENT DOCUMENTS

| | | | |
|---|---|---|---|
| 2006/0044357 | A1 | 3/2006 | Andersen |
| 2006/0087064 | A1 | 4/2006 | Daniel et al. |
| 2006/0125500 | A1 | 6/2006 | Watkins et al. |
| 2006/0145338 | A1 | 7/2006 | Dong |
| 2006/0149491 | A1 | 7/2006 | Flach et al. |
| 2006/0157103 | A1 | 7/2006 | Sheats et al. |
| 2006/0160379 | A1 | 7/2006 | Rathburn |
| 2006/0186906 | A1 | 8/2006 | Bottoms et al. |
| 2006/0208230 | A1 | 9/2006 | Cho et al. |
| 2006/0258912 | A1 | 11/2006 | Belson et al. |
| 2006/0261827 | A1 | 11/2006 | Cooper et al. |
| 2006/0265919 | A1 | 11/2006 | Huang |
| 2006/0281303 | A1 | 12/2006 | Trezza et al. |
| 2007/0021002 | A1 | 1/2007 | Laurx et al. |
| 2007/0057382 | A1 | 3/2007 | Liu et al. |
| 2007/0059901 | A1 | 3/2007 | Majumdar et al. |
| 2007/0145981 | A1 | 6/2007 | Tomita et al. |
| 2007/0148822 | A1 | 6/2007 | Haba et al. |
| 2007/0170595 | A1 | 7/2007 | Sinha |
| 2007/0182431 | A1 | 8/2007 | Komatsu et al. |
| 2007/0201209 | A1 | 8/2007 | Francis et al. |
| 2007/0221404 | A1 | 9/2007 | Das et al. |
| 2007/0224735 | A1 | 9/2007 | Karashima et al. |
| 2007/0232059 | A1 | 10/2007 | Abe |
| 2007/0259539 | A1 | 11/2007 | Brown et al. |
| 2007/0267138 | A1 | 11/2007 | White et al. |
| 2007/0269999 | A1 | 11/2007 | Di Stefano |
| 2007/0273394 | A1 | 11/2007 | Tanner et al. |
| 2007/0287304 | A1 | 12/2007 | Eldridge |
| 2007/0289127 | A1 | 12/2007 | Hurwitz et al. |
| 2007/0296090 | A1 | 12/2007 | Hembree |
| 2008/0008822 | A1 | 1/2008 | Kowalski |
| 2008/0020566 | A1 | 1/2008 | Egitto et al. |
| 2008/0020624 | A1 | 1/2008 | Nikaido et al. |
| 2008/0041822 | A1 | 2/2008 | Wang |
| 2008/0057753 | A1 | 3/2008 | Rathburn et al. |
| 2008/0060838 | A1 | 3/2008 | Chen et al. |
| 2008/0073110 | A1 | 3/2008 | Shioga et al. |
| 2008/0093115 | A1 | 4/2008 | Lee |
| 2008/0115961 | A1 | 5/2008 | Mok et al. |
| 2008/0143358 | A1 | 6/2008 | Breinlinger |
| 2008/0143367 | A1 | 6/2008 | Chabineau-Lovgren |
| 2008/0156856 | A1 | 7/2008 | Barausky et al. |
| 2008/0157361 | A1 | 7/2008 | Wood et al. |
| 2008/0185180 | A1 | 8/2008 | Cheng et al. |
| 2008/0197867 | A1 | 8/2008 | Wokhlu et al. |
| 2008/0220584 | A1 | 9/2008 | Kim et al. |
| 2008/0241997 | A1 | 10/2008 | Sunohara et al. |
| 2008/0246136 | A1 | 10/2008 | Haba et al. |
| 2008/0248596 | A1 | 10/2008 | Das et al. |
| 2008/0250363 | A1 | 10/2008 | Goto et al. |
| 2008/0265919 | A1 | 10/2008 | Izadian |
| 2008/0290885 | A1 | 11/2008 | Matsunami |
| 2008/0309349 | A1 | 12/2008 | Sutono |
| 2009/0039496 | A1 | 2/2009 | Beer et al. |
| 2009/0058444 | A1 | 3/2009 | McIntyre |
| 2009/0061089 | A1 | 3/2009 | King |
| 2009/0127698 | A1 | 5/2009 | Rathburn |
| 2009/0133906 | A1 | 5/2009 | Baek |
| 2009/0158581 | A1 | 6/2009 | Nguyen et al. |
| 2009/0180236 | A1 | 7/2009 | Lee et al. |
| 2009/0224404 | A1 | 9/2009 | Wood et al. |
| 2009/0241332 | A1 | 10/2009 | Lauffer et al. |
| 2009/0267628 | A1 | 10/2009 | Takase |
| 2009/0321915 | A1 | 12/2009 | Hu et al. |
| 2010/0133680 | A1 | 6/2010 | Kang et al. |
| 2010/0143194 | A1 | 6/2010 | Lee et al. |
| 2010/0213960 | A1 | 8/2010 | Mok et al. |
| 2010/0300734 | A1 | 12/2010 | Ables et al. |
| 2011/0083881 | A1 | 4/2011 | Nguyen et al. |
| 2011/0101540 | A1 | 5/2011 | Chainer |
| 2012/0017437 | A1 | 1/2012 | Das et al. |
| 2012/0043119 | A1 | 2/2012 | Rathburn |
| 2012/0043130 | A1 | 2/2012 | Rathburn |
| 2012/0043667 | A1 | 2/2012 | Rathburn |
| 2012/0044659 | A1 | 2/2012 | Rathburn |
| 2012/0049342 | A1 | 3/2012 | Rathburn |
| 2012/0049877 | A1 | 3/2012 | Rathburn |
| 2012/0051016 | A1 | 3/2012 | Rathburn |
| 2012/0055701 | A1 | 3/2012 | Rathburn |
| 2012/0055702 | A1 | 3/2012 | Rathburn |
| 2012/0056332 | A1 | 3/2012 | Rathburn |
| 2012/0056640 | A1 | 3/2012 | Rathburn |
| 2012/0058653 | A1 | 3/2012 | Rathburn |
| 2012/0061846 | A1 | 3/2012 | Rathburn |
| 2012/0061851 | A1 | 3/2012 | Rathburn |
| 2012/0062270 | A1 | 3/2012 | Rathburn |
| 2012/0068727 | A1 | 3/2012 | Rathburn |
| 2012/0161317 | A1 | 6/2012 | Rathburn |
| 2012/0164888 | A1 | 6/2012 | Rathburn |
| 2012/0168948 | A1 | 7/2012 | Rathburn |
| 2012/0171907 | A1 | 7/2012 | Rathburn |
| 2012/0182035 | A1 | 7/2012 | Rathburn |
| 2012/0199985 | A1 | 8/2012 | Rathburn |
| 2012/0202364 | A1 | 8/2012 | Rathburn |
| 2012/0244728 | A1 | 9/2012 | Rathburn |
| 2012/0252164 | A1 | 10/2012 | Nakao et al. |
| 2012/0257343 | A1 | 10/2012 | Das et al. |
| 2012/0268155 | A1 | 10/2012 | Rathburn |
| 2013/0078860 | A1 | 3/2013 | Rathburn |
| 2013/0105984 | A1 | 5/2013 | Rathburn |
| 2013/0203273 | A1 | 8/2013 | Rathburn |
| 2013/0206468 | A1 | 8/2013 | Rathburn |
| 2013/0210276 | A1 | 8/2013 | Rathburn |
| 2013/0223034 | A1 | 8/2013 | Rathburn |
| 2013/0244490 | A1 | 9/2013 | Rathburn |
| 2013/0330942 | A1 | 12/2013 | Rathburn |
| 2014/0043782 | A1 | 2/2014 | Rathburn |
| 2014/0080258 | A1 | 3/2014 | Rathburn |
| 2014/0192498 | A1 | 7/2014 | Rathburn |
| 2014/0220797 | A1 | 8/2014 | Rathburn |
| 2014/0225255 | A1 | 8/2014 | Rathburn |
| 2014/0242816 | A1 | 8/2014 | Rathburn |
| 2015/0013901 | A1 | 1/2015 | Rathburn |
| 2015/0091600 | A1 | 4/2015 | Rathburn |
| 2015/0136467 | A1 | 5/2015 | Rathburn |
| 2015/0162678 | A1 | 6/2015 | Rathburn |
| 2015/0181710 | A1 | 6/2015 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |

(56) References Cited

FOREIGN PATENT DOCUMENTS

| | | |
|---|---|---|
| WO | WO 2014/011228 | 1/2014 |
| WO | WO 2014/011232 | 1/2014 |
| WO | WO-2015/006393 | 1/2015 |

OTHER PUBLICATIONS

Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Print—Definition of Print by the Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/319,120, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Notice of Allowance and Fee(s) Due mailed Apr. 9, 2015 in co-pending U.S. Appl. No. 13/266,573, now issued as U.S. Pat. No. 9,054,097.
Notice of Allowance and Fee(s) Due mailed Apr. 13, 2015 in co-pending U.S. Appl. No. 13/318,200, now published as US Patent Application Publication No. US 2012/0056332.
Notice of Allowance and Fee(s) Due mailed May 18, 2015 in co-pending U.S. Appl. No. 14/086,029, now issued as U.S. Pat. No. 9,076,884.
Final Office Action mailed Jun. 30, 2015 in co-pending U.S. Appl. No. 13/318,369, now published as US Patent Application Publication No. US 2012/0043119.
Office Action mailed Apr. 23, 2015 in co-pending U.S. Appl. No. 13/319,158, now published as US Patent Application Publication No. 2012/0051016.
Office Action mailed Apr. 2, 2015 in co-pending U.S. Appl. No. 13/700,639, now published as US Patent Application Publication No. 2013/0078860.
Final Office Action mailed Apr. 23, 2015 in co-pending U.S. Appl. No. 13/879,783, now published as US Patent Application Publication No. 2013/0223034.
Notice of Allowance and Fee(s) Due mailed May 28, 2015 in co-pending U.S. Appl. No. 13/879,883, now published as US Patent Application Publication No. 2013/0244490.

(56) References Cited

OTHER PUBLICATIONS

Office Action mailed May 22, 2015 in co-pending U.S. Appl. No. 13/880,231, now published as US Patent Application Publication No. 2013/0210276.
Office Action mailed May 4, 2015 in co-pending U.S. Appl. No. 13/880,231, now published as US Patent Application Publication No. 2013/0210276.
Notice of Allowance and Fee(s) Due mailed Jun. 4, 2015 in co-pending U.S. Appl. No. 13/410,914, now published as US Patent Application Publication No. US 2012/0164888.
Notification of Transmittal of the International Search Report and the Written Opinion of the International Searching Authority mailed Jul. 30, 2010 in International Application No. PCT/US2010/036043.
Notification of Transmittal of the International Search Report and the Written Opinion of the International Searching Authority mailed Jul. 21, 2010 in International Application No. PCT/US2010/036047.
Notification of Transmittal of the International Search Report and the Written Opinion of the International Searching Authority mailed Jul. 28, 2010 in International Application No. PCT/US2010/036363.
Notification of Transmittal of the International Search Report and the Written Opinion of the International Searching Authority mailed Jul. 28, 2010 in International Application No. PCT/US2010/036377.
Notification of Transmittal of the International Search Report and the Written Opinion of the International Searching Authority mailed Jul. 30, 2010 in International Application No. PCT/US2010/036388.
Notification of Transmittal of the International Search Report and the Written Opinion of the International Searching Authority mailed Jul. 27, 2010 in International Application No. PCT/US2010/036397.
Notification of Transmittal of the International Search Report and the Written Opinion of the International Searching Authority mailed Jul. 30, 2010 in International Application No. PCT/US2010/036055.
Notification of Transmittal of the International Search Report and the Written Opinion of the International Searching Authority mailed Aug. 4, 2010 in International Application No. PCT/US2010/036288.
Notification of Transmittal of the International Search Report and the Written Opinion of the International Searching Authority mailed Aug. 4, 2010 in International Application No. PCT/US2010/036285.
Notification of Transmittal of the International Search Report and the Written Opinion of the International Searching Authority mailed Jul. 30, 2010 in International Application No. PCT/US2010/036282.
Notification of Transmittal of the International Search Report and the Written Opinion of the International Searching Authority mailed Jul. 30, 2010 in International Application No. PCT/US2010/036295.
Notification of Transmittal of the International Search Report and the Written Opinion of the International Searching Authority mailed Jul. 30, 2010 in International Application No. PCT/US2010/036313.
Notification of Transmittal of the International Search Report and the Written Opinion of the International Searching Authority mailed Aug. 3, 2010 in International Application No. PCT/US2010/037619.
Notification of Transmittal of the International Search Report and the Written Opinion of the International Searching Authority mailed Sep. 7, 2010 in International Application No. PCT/US2010/038600.
Notification of Transmittal of the International Search Report and the Written Opinion of the International Searching Authority mailed Aug. 18, 2010 in International Application No. PCT/US2010/038606.
Notification of Transmittal of the International Search Report and the Written Opinion of the International Searching Authority mailed Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority mailed Apr. 14, 2011 in International Application No. PCT/US2011/023138.
Notification of Transmittal of the International Search Report and the Written Opinion of the International Searching Authority mailed Aug. 17, 2011 in International Application No. PCT/US2011/033726.
Notification of Transmittal of the International Search Report and the Written Opinion of the International Searching Authority mailed Sep. 27, 2011 in International Application No. PCT/US2011/038845.
Co-pending U.S. Appl. No. 14/238,638 titled Direct Metalization of Electrical Circuit Structure, filed Feb. 12, 2014.
Co-pending U.S. Appl. No. 14/254,038 titled High Performance Electrical Connector With Translated Insulator Contact Positioning, filed Apr. 16, 2014.
Final Office Action mailed Mar. 16, 2015 in co-pending U.S. Appl. No. 13/320,285, now published as US Patent Application Publication No. US 2012/0055702.
Final Office Action mailed Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 13/319,158, now published as US Patent Application Publication No. 2012/0051016.
Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.
Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action mailed Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.
Notification of Transmittal of the International Search Report and the Written Opinion of the International Searching Authority mailed Feb. 8, 2012 in International Application No. PCT/US2011/056664.
Notification of Transmittal of the International Search Report and the Written Opinion of the International Searching Authority mailed Mar. 26, 2012 in International Application No. PCT/US2011/062313.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Notification of Transmittal of the International Search Report and the Written Opinion of the International Searching Authority mailed Jun. 3, 2013 in International Application No. PCT/US2013/031395.
Notification of Transmittal of the International Search Report and the Written Opinion of the International Searching Authority mailed Jun. 19, 2013 in International Application No. PCT/US2013/030981.

(56) References Cited

OTHER PUBLICATIONS

Notification of Transmittal of the International Search Report and the Written Opinion of the International Searching Authority mailed Jun. 7, 2013 in International Application No. PCT/US2013/030856.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated with Inkjet Printing Technique," Solid-State Electronics, vol. 47, pp. 1543-1548 (2003).
Restriction Requirement mailed Jun. 13, 2013 in co-pending U.S. Appl. No. 13/266,486, now published as US Patent Application Publication No. US 2012/0055701.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Restriction Requirement mailed Oct. 1, 2013 in co-pending U.S. Appl. No. 13/319,145, now published as US Patent Application Publication No. 2012/0049342.
Response to Restriction Requirement filed Oct. 4, 2013 in co-pending U.S. Appl. No. 13/319,145, now published as US Patent Application Publication No. 2012/0049342.
Office Action mailed Dec. 26, 2013 in co-pending U.S. Appl. No. 13/319,145, now published as US Patent Application Publication No. 2012/0049342.
Office Action mailed Nov. 22, 2013 in co-pending U.S. Appl. No. 13/266,907, now published as US Patent Application Publication No. US 2012/0268155.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Notice of Allowance and Fee(s) Due mailed Mar. 14, 2014 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Response to Restriction Requirement filed Jan. 28, 2014 in co-pending U.S. Appl. No. 13/318,181, now published as US Patent Application Publication No. US 2012/0044659.
Office Action mailed Apr. 21, 2014 in co-pending U.S. Appl. No. 13/318,181, now published as US Patent Application Publication No. US 2012/0044659.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 2013 in co-pending U.S. Appl. No. 13/318,200, now published as US Patent Application Publication No. US 2012/0056332.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Office Action mailed Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.

(56) References Cited

OTHER PUBLICATIONS

Amendment and Response filed Oct. 2, 2013 in co-pending U.S. Appl. No. 13/320,285, now published as US Patent Application Publication No. US 2012/0055702.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
RCE filed Mar. 10, 2014 in co-pending U.S. Appl. No. 13/320,285, now published as US Patent Application Publication No. US 2012/0055702.
Restriction Requirement mailed Sep. 26, 2013 in co-pending U.S. Appl. No. 13/319,120 now published as US Patent Application Publication No. US 2012/0061851.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Jan. 17, 2014 in co-pending U.S. Appl. No. 13/319,120 now published as US Patent Application Publication No. US 2012/0061851.
Amendment and Response filed Apr. 16, 2014 in co-pending U.S. Appl. No. 13/319,120 now published as US Patent Application Publication No. US 2012/0061851.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Response to Restriction Requirement filed Oct. 4, 2013 in co-pending U.S. Appl. No. 13/266,573, now published as US Patent Application Publication No. 2012/0061846.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Examiner-Initiated Interview Summary mailed Mar. 14, 2013 in co-pending U.S. Appl. No. 13/319,228, now published as US Patent Application Publication No. US 2012/0058653.
Restriction Requirement mailed Apr. 23, 2014 in co-pending U.S. Appl. No. 13/319,228, now published as US Patent Application Publication No. US 2012/0058653.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Office Action mailed Apr. 24, 2014 in co-pending U.S. Appl. No. 13/700,639, now published as US Patent Application Publication No. 2013/0078860.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Dec. 16, 2013 in co-pending U.S. Appl. No. 13/410,914, now published as US Patent Application Publication No. US 2012/0164888.
Amendment and Response filed Mar. 17, 2014 in co-pending U.S. Appl. No. 13/410,914, now published as US Patent Application Publication No, US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Notice of Allowance and Fee(s) Due mailed Feb. 26, 2014 in co-pending U.S. Appl. No. 13/412,870, now published as US Patent Application Publication No. US 2012/0171907.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed Sep. 16, 2013 in co-pending U.S. Appl. No. 13/413,724, now published as US Patent Application Publication No. US 2012/0168948.
Amendment and Response filed Nov. 20, 2013 in co-pending U.S. Appl. No. 13/413,724, now published as US Patent Application Publication No. US 2012/0168948.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Notice of Allowance and Fee(s) Due mailed Oct. 2, 2013 in co-pending U.S. Appl. No. 13/448,865, now published as US Patent Application Publication No. US 2012/0199985.
Notice of Allowance and Fee(s) Due mailed Dec. 6, 2013 in co-pending U.S. Appl. No. 14/058,863, now published as US Patent Application Publication No. 2014/0043782.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.

(56) References Cited

OTHER PUBLICATIONS

Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notice of Allowance and Fee(s) Due mailed Jul. 28, 2013 in co-pending U.S. Appl. No. 13/448,914, now published as US Patent Application Publication No. US 2012/0202364.
Office Action mailed Oct. 7, 2013 in co-pending U.S. Appl. No. 13/969,953, now issued as U.S. Pat. No. 8,704,377.
Amendment and Response and Terminal Disclaimer filed Nov. 20, 2013 in co-pending U.S. Appl. No. 13/969,953, now issued as U.S. Pat. No. 8,704,377.
Final Office Action mailed Dec. 20, 2013 in co-pending U.S. Appl. No. 13/969,953, now issued as U.S. Pat. No. 8,704,377.
Amendment and Response to Final Office filed Dec. 30, 2013 in co-pending U.S. Appl. No. 13/969,953, now issued as U.S. Pat. No. 8,704,377.
Notice of Allowance and Fee(s) Due mailed Jan. 22, 2014 in co-pending U.S. Appl. No. 13/969,953, now issued as U.S. Pat. No. 8,704,377.
Notification of Transmittal of the International Search Report and the Written Opinion of the International Searching Authority mailed Oct. 27, 2014 in International Application No. PCT/US2014/045856.
Ex Parte Quayle Action mailed Oct. 1, 2014 in co-pending U.S. Appl. No. 13/266,486, now published as US Patent Application Publication No. US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Amendment and Response filed Sep. 9, 2014 in co-pending U.S. Appl. No. 13/266,573, now published as US Patent Application Publication No. 2012/0061846.
Notice of Allowance and Fee(s) Due mailed Oct. 8, 2014 in co-pending U.S. Appl. No. 13/266,907, now published as US Patent Application Publication No. US 2012/0268155.
Amendment and Response Under Rule 1.116 and Termination Disclaimer filed Sep. 4, 2014 in co-pending U.S. Appl. No. 13/318,038, now published as US Patent Application Publication No. US 2012/0062270.
Terminal Disclaimer Review Decision mailed Sep. 8, 2014 in co-pending U.S. Appl. No. 13/318,038, now published as US Patent Application Publication No. US 2012/0062270.
Notice of Allowance and Fee(s) Due mailed Sep. 30, 2014 in co-pending U.S. Appl. No. 13/318,038, now published as US Patent Application Publication No. US 2012/0062270.
Notice of Allowance and Fee(s) Due mailed Oct. 24, 2014 in co-pending U.S. Appl. No. 13/318,181, now published as US Patent Application Publication No. US 2012/0044659.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Final Office Action mailed Nov. 6, 2014 in co-pending U.S. Appl. No. 13/319,158, now published as US Patent Application Publication No. 2012/0051016.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Final Office Action mailed Sep. 8, 2014 in co-pending U.S. Appl. No. 13/700,639, now published as US Patent Application Publication No. 2013/0078860.
Office Action mailed Oct. 6, 2014 in co-pending U.S. Appl. No. 13/879,783, now published as US Patent Application Publication No. 2013/0223034.
Amendment and Response and RCE filed Sep. 30, 2014 in co-pending U.S. Appl. No. 13/410,914, now published as US Patent Application Publication No. US 2012/0164888.
Final Office Action mailed Oct. 28, 2014 in co-pending U.S. Appl. No. 13/418,853, now published as US Patent Application Publication No. US 2012/0244728.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Supplemental Notice of Allowance mailed Dec. 19, 2014 in co-pending U.S. Appl. No. 13/318,181, now published as US Patent Application Publication No. US 2012/0044659.
Office Action mailed Nov. 19, 2014 in co-pending U.S. Appl. No. 13/318,200, now published as US Patent Application Publication No. US 2012/0056332.
Office Action mailed Nov. 14, 2014 in co-pending U.S. Appl. No. 13/318,369, now published as US Patent Application Publication No. US 2012/0043119.
Amendment and Response and Terminal Disclaimer filed Nov. 14, 2014 in co-pending U.S. Appl. No. 13/318,382, now published as US Patent Application Publication No. US 2012/0043130.
Notice of Allowance and Fee(s) Due mailed Dec. 19, 2014 in co-pending U.S. Appl. No. 13/319,145 now published as US Patent Application Publication No. US 2012/0049342.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Request for Continued Examination filed Nov. 12, 2014 in co-pending U.S. Appl. No. 13/319,203, now published as US Patent Application Publication No. 2012/0056640.

(56) References Cited

OTHER PUBLICATIONS

Notice of Allowance and Fee(s) Due mailed Dec. 10, 2014 in co-pending U.S. Appl. No. 13/319,203, now published as US Patent Application Publication No. 2012/0056640.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Amendment and Response filed Nov. 19, 2014 in co-pending U.S. Appl. No. 13/643,436, now published as US Patent Application Publication No. 2013/0105984.
Response Under Rule 1.116 filed Nov. 11, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Office Action mailed Nov. 17, 2014 in co-pending U.S. Appl. No. 13/879,883, now published as US Patent Application Publication No. 2013/0244490.
Office Action mailed Dec. 26, 2014 in co-pending U.S. Appl. No. 13/410,914, now published as US Patent Application Publication No. US 2012/0164888.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,039 titled High Speed Circuit Assembly With Integral Terminal and Mating Bias Loading Electrical Connector Assembly, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.

METHOD OF MAKING AN ELECTRONIC INTERCONNECT

RELATED APPLICATION

This application claims the benefit of U.S. Provisional Application No. 61/812,455, filed Apr. 16, 2013, the disclosure of which is hereby incorporated by reference.

This application is a continuation-in-part of U.S. patent application Ser. No. 13/320,285, entitled COMPLIANT PRINTED FLEXIBLE CIRCUIT, filed Nov. 14, 2011, which is a national stage application under 35 U.S.C. §371 of International Application No. PCT/US2010/036282, titled COMPLIANT PRINTED FLEXIBLE CIRCUIT, filed May 27, 2010, which claims priority to U.S. Provisional Application No. 61/183,340, filed Jun. 2, 2009, both of which are hereby incorporated by reference in their entireties.

This application is a continuation-in-part of U.S. patent application Ser. No. 13/318,369, entitled COMPOSITE POLYMER-METAL ELECTRICAL CONTACT filed Nov. 1, 2011, which is a national stage application under 35 U.S.C. §371 of International Application No. PCT/US2010/036295, titled COMPOSITE POLYMER-METAL ELECTRICAL CONTACT, filed May 27, 2010, which claims priority to U.S. Provisional Application No. 61/183,324, filed Jun. 2, 2009, both of which are hereby incorporated by reference in their entireties.

This application is a continuation-in-part of U.S. patent application Ser. No. 13/319,158, entitled SEMICONDUCTOR SOCKET, filed Nov. 22, 2011, which is a national stage application under 35 U.S.C. §371 of International Application No. PCT/US2010/038606, titled SEMICONDUCTOR SOCKET, filed Jun. 15, 2010, which claims priority to U.S. Provisional Application No. 61/187,873, filed Jun. 17, 2009, all of which are hereby incorporated by reference in their entireties.

This application is a continuation-in-part of U.S. patent application Ser. No. 14/238,638, entitled DIRECT METALIZATION OF ELECTRICAL CIRCUIT STRUCTURES, filed Feb. 12, 2014, which is a national stage application under 35 U.S.C. §371 of International Application No. PCT/US2012/053848, titled DIRECT METALIZATION OF ELECTRICAL CIRCUIT STRUCTURES, filed Sep. 6, 2012, which claims priority to U.S. Provisional Application No. 61/532,379, filed Sep. 8, 2011, all of which are hereby incorporated by reference in their entireties.

TECHNICAL FIELD

The present application relates to a high performance electrical interconnect that forms an electrical interconnect between an integrated circuit and another circuit member.

BACKGROUND OF THE INVENTION

Traditional IC sockets are generally constructed of an injection molded plastic insulator housing which has stamped and formed copper alloy contact members stitched or inserted into positions within the housing that are shaped to accept and retain the contact members. The assembled socket body is then generally processed through a reflow oven which melts solder balls and attaches them to the base of the contact member.

During final assembly onto the PCA, the target interconnect positions on the circuit board are printed with solder paste or flux and the socket assembly is placed such that the solder balls on the socket contacts land onto the target pads on the PCB. The assembly is then reflowed and the solder balls on the socket melt and when cooled they essentially weld the socket contacts to the PCB, creating the electrical path for signal and power interaction with the system.

During use, this assembled socket receives the packaged integrated circuits and connects each terminal on the package to the corresponding terminal on the PCB. The terminals on the package are held against the contact members by applying a load to the package, which is expected to maintain intimate contact and reliable circuit connection throughout the life of the system, without a permanent connection such that the package can be removed or replaced without the need for reflowing solder connections.

These types of sockets and interconnects have been produced in high volume for many years. As systems advance to next generation architectures, these traditional have reached mechanical and electrical limitations that mandate alternate methods.

As processors and systems have evolved, several factors have impacted the design of traditional sockets. Increased terminal counts, reductions in the distance between the contacts known as terminal pitch, and signal integrity have been main drivers that impact the socket and contact design. As terminal counts go up, the IC package essentially gets larger due to the additional space needed for the terminals. As the package grows larger, costs go up and the relative flatness of the package and corresponding PCB require compliance between the contact and the terminal pad to accommodate the topography differences and maintain reliable connection.

The package producers tend to drive the terminal pitch smaller so they can reduce the size of the package as well as the flatness effects. As the terminal pitch is reduced, the available area to place a contact is also reduced, which limits the space available to locate a spring or contact member which can deflect without touching an adjacent contact. In order to maximize the length of the spring so that it can deflect the proper amount without damage, the thickness of the insulating walls within the plastic housing is reduced which increases the difficulty of molding as well as the latent stress in the molded housing which causes warping applied during solder reflow.

For mechanical reasons, the contacts tend to be long in order to obtain proper spring properties. Long contact members, however, tend to reduce the electrical performance of the connection by creating a parasitic effect that impacts the signal as it travels through the contact. Other effects such as contact resistance impact the self-heating effects as current passes through power delivering contacts, and the small space between contacts can cause distortion as a nearby contact influences the neighbor which is known as cross talk.

Traditional socket methods are able to meet the mechanical compliance requirements of today's needs, but they have reached an electrical performance limit. Next generation systems will operate above 5 GHz and beyond and the existing interconnects will not achieve acceptable performance levels without significant revision.

BRIEF SUMMARY OF THE INVENTION

The present disclosure relates to an electrical interconnect with metallic contact structures that provide reliable flexural properties. In one embodiment, the metallic contact structures mimic the mechanical details of a simple beam structure made of traditional materials, but removes the normal retention features that add parasitic mass and distort or degrade the integrity of the signal. The present disclosure provides a reliable connection to the package terminals and creates a platform to add electrical and mechanical enhancements to the socket substrate or assembly to address the challenges of next generation interconnect requirements. The lack of contact member retention features greatly reduces the complexity of the contact members and the tooling required to produce them.

In one embodiment, the electrical interconnect includes a substrate with a plurality of layer. At least two adjacent layers are configured to translate relative to each other between a nominal position and a translated position. A plurality of through holes extend through the layers from a first surface of the substrate to a second surface of the substrate in both the nominal position and the translated position. At least one contact member is located in the through holes with distal portions accessible from the first surface of the substrate and proximal portions positioned near the second surface. Conductive structures accessible from the second surface secure the proximal portions of the contact members to the substrate. Translation of the two adjacent layers of the substrate from the nominal position to the translated position elastically deforms the contact members within the through holes of the substrate and displaces the distal portions of the contact members toward the conductive structures, respectively.

In one embodiment, the contact members can be constructed as multi-layered structures with layers of conductive material, such as CuNiSi, and layers of dielectric material, such as LCP, Kapton, or a dielectric coating. In one embodiment, the conductive material is formed into at least two conductive traces extending from the conductive structures to the distal portions of the contact members. The conductive material can be configured as one of a coaxial line, a twin axial lines, or coaxial/twin axial via structure.

The through holes preferably include a plurality of inner walls that engage with the contact members in the translated position. In one embodiment, protrusions on one of the layers displace center portions of the contact members in the translated position. Solder balls are optionally attached to the conductive structures and extend above the second surface of the substrate.

The present disclosure is also directed to a method of making an electrical interconnect. A plurality of layers are arranged into a substrate with at least two adjacent layers configured to translate relative to each other between a nominal position and a translated position. A plurality of through holes are formed through the layers from a first surface of the substrate to a second surface of the substrate in both the nominal position and the translated position. At least one contact member is positioned in the through holes with distal portions accessible from the first surface of the substrate and proximal portions positioned near the second surface. The proximal portion of the contact members are secured to the substrate near the second surface with a conductive structure. The two adjacent layers of the substrate are translated from the nominal position to the translated position to elastically deform the contact members within the through holes of the substrate and to displace the distal portions of the contact members toward the conductive structures, respectively.

DETAILED DESCRIPTION OF THE INVENTION

An electrical interconnect in accordance with the present disclosure permits fine contact-to-contact spacing (pitch) on the order of less than 1.0 millimeter ($1\times10^{-3}$ meter), and more preferably a pitch of less than about 0.7 millimeter, and most preferably a pitch of less than about 0.4 millimeter. Such fine pitch electrical interconnects are especially useful for communications, wireless, and memory devices. The disclosed low cost, high signal performance electrical interconnects, which have low profiles and can be soldered to the system PC board, are particularly useful for desktop and mobile PC applications.

The disclosed electrical interconnects permit IC devices to be installed and uninstalled without the need to reflow solder. The solder-free electrical connection of the IC devices is environmentally friendly.

Figures 1A, 1B:
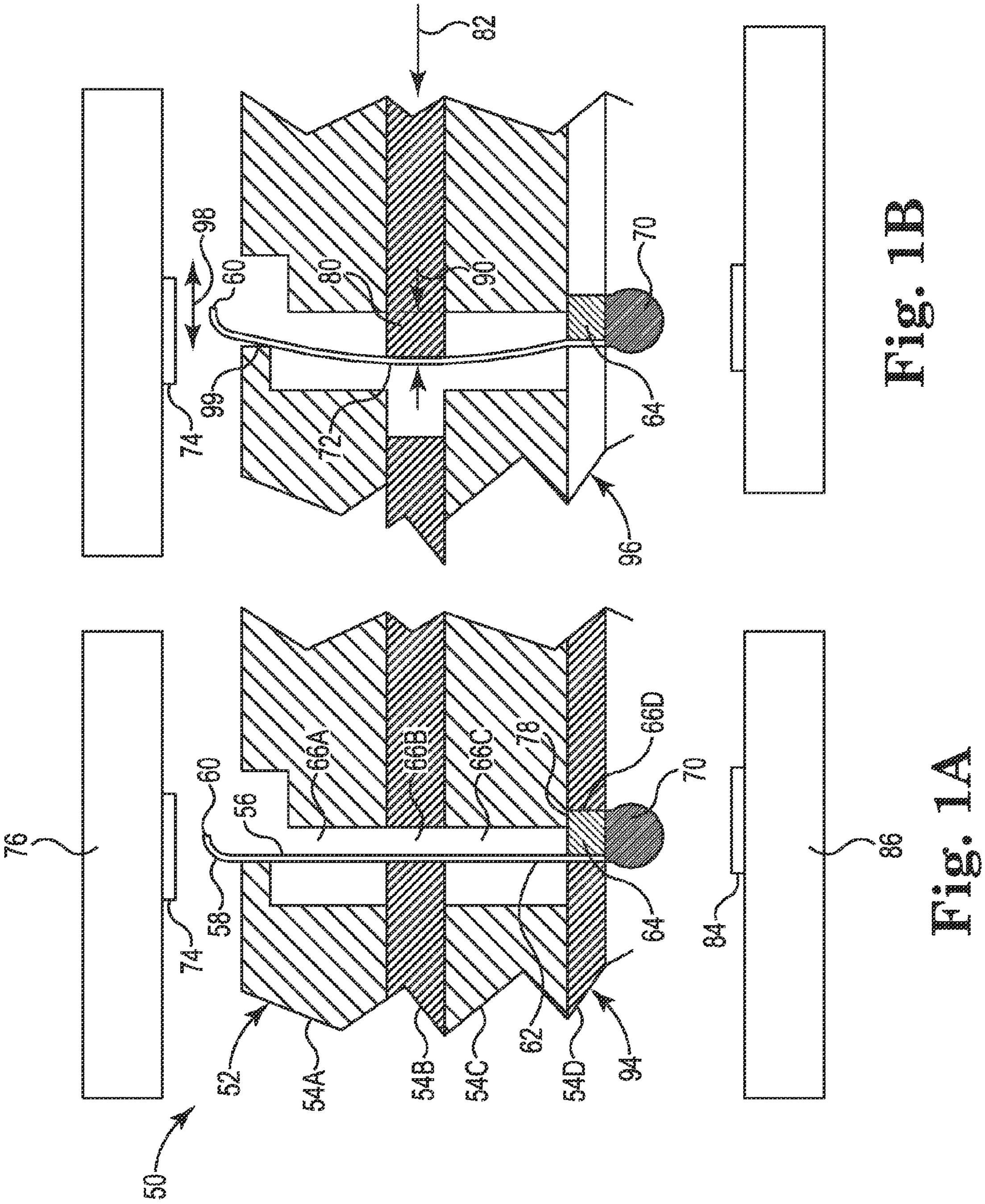
FIG. 1A is a cross-sectional view of an electrical interconnect in a nominal position in accordance with an embodiment of the present disclosure.
FIG. 1B is a cross-sectional view of an electrical interconnect in a translated position in accordance with an embodiment of the present disclosure.

FIG. 1A is a side cross-sectional view of a portion of an electrical interconnect 50 in accordance with an embodiment of the present disclosure. Substrate 52 includes a plurality of layers 54A, 54B, 54C, 54D (collectively "54") each with respective openings 66A, 66B, 66C, 66D ("66") that are generally aligned to receive contact members 56.

At least one of the layers 54 can be translated relative to the other layers 54. In the illustrated embodiment, layer 54B translates relative to the layers 54A, 54C, 54D. In an alternate embodiment, the housing 52 has only two layers in which the upper layer translates relative to the lower layer. The translation of the layers can be linear, circular, or a combination thereof, and may encompass one, two, or three degrees of freedom.

A plurality of discrete contact members 56 are inserted into the substrate, preferably through opening 66D so distal portions 68 extend into openings 66A, 66B, 66C. The contact members 56 can be positioned into the recesses 66D using a variety of techniques, such as for example stitching or vibratory techniques.

Proximal end 62 of the contact members 56 includes plated copper structure 64. The plated copper structure 64 can be located on one or more sides of the contact member 56. The copper structure 64 is preferably sized to permit the contact member 56 to be inserted into opening 66D in the layer 54D, while distal end 68 of the contact member 56 extends into openings 66A, 66B, 66C ("66"). Shoulder 78 on the layer 54C limits the insertion depth of the copper structure 64 into the opening 66D. In one embodiment, the copper structure 64 is press fit into the opening 66D. As a result, the proximal end 62 of the contact members 56 are preferably fixed relative to the layer 54D.

The contact members 56 are preferably constructed of copper or similar metallic materials such as phosphor bronze or beryllium-copper. The contact members are preferably plated with a corrosion resistant metallic material, such as nickel, gold, silver, palladium, or multiple layers thereof. Suitable contact members are disclosed in U.S. Pat. No. 6,247,938 (Rathburn) and U.S. Pat. No. 6,461,183 (Ohkita et al.), which are hereby incorporated by reference.

In the illustrated embodiment, the contact members 56 are simple beam structures. There is a slight radius 58 on the tip 60 of the contact members 56 to facilitate engagement with contact pads 74 on circuit member 76. The distal portions 68 preferably have a generally uniform cross section. The cross-sectional shape can be rectangular, square, circular, triangular, or a variety of other shapes. As used herein, the term "circuit member" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

With contact members 56 inserted, the substrate 52 is optionally inverted to expose the proximal ends 62 and the copper structure 64. The proximal ends 62 and copper structures 64 can then be subjected to additional processing. For example, solder balls 70 are optionally formed on exposed surface 88 of the copper structure 64 to electrically couple with contact pads 84 on circuit member 86.

As best illustrated in FIG. 1B, the contact member 56 is a buckling beam structure that is relatively flat and straight when inserted into the openings 66. Translating the layer 54B in direction 82 to translated position 96 induces a bow in the contact member 56 that shifts tip 60 toward copper structure 64 and stores energy in the contact member 56.

In the translated position 96, the contact member 56 is engaged with the substrate 52 at three points—the copper structure 64, the protrusion 80 of the layer 54B, and the shoulder 99 on the layer 54A. Bending the contact member 56 near center portion 72 results in minimal lateral displacement of the tip 60 in directions 98. That is, the primary mode of displacement of the tip 60 is toward the copper structure 64, reducing the chance of misalignment with the contact pads 74.

After the tip 60 is engaged with contact pad 74 on circuit member 76, the sliding layer 54B is optionally returned to its nominal position 94 shown in FIG. 1A, resulting in the tip 60 being pressed into engagement with contact pad 74.

In one embodiment, protrusions 80 on the sliding layer 54B are selectively removed so that only a portion of the contact members 56 are bowed during translation of the layer 54B. In another embodiment, some of the protrusions 80 on the sliding layer 54B are selectively resized so that the degree of elastic deformation of the contact members 56 varies from contact to contact. In another embodiment the length 90 of the protrusions 80 along displacement axis 82 may be varied within the layer 54B. In an array of contact members 56 the resulting deformation can be controlled on a contact by contact basis. For example, the length 90 may be greater toward the center of the array than at the edges.

Although the substrate 52 is illustrated as a generally planar structure, an electrical interconnect according to the present disclosure may include one or more recesses for receiving IC devices and a cover assembly for retaining the IC devices to the substrate 52, such as disclosed in U.S. Pat. No. 7,101,210 (Lin et al.); U.S. Pat. No. 6,971,902 (Taylor et al.); U.S. Pat. No. 6,758,691 (McHugh et al.); U.S. Pat. No. 6,461,183 (Ohkita et al.); and U.S. Pat. No. 5,161,983 (Ohno et al.), which are hereby incorporated by reference.

The substrate 52 may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

The substrate 52 may also be constructed from metal, such as aluminum, copper, or alloys thereof, with a non-conductive surface, such as an anodized surface. In another embodiment, a metal substrate can be overmolded with a dielectric polymeric material. For example, a copper substrate may be placed in a mold and plastic may be injected around it.

In embodiments where the substrate 52 is a coated metal, the substrate 52 can be grounded to the electrical system, thus providing a controlled impedance environment. Some of contact members 56 can be grounded by permitting them to contact an uncoated surface of the metal housing.

The substrate 52 may also include stiffening layers, such as metal, ceramic, or alternate filled resins, to be added to maintain flatness where a molded or machined part might warp. The substrate 52 may also be multi-layered (having a plurality of discrete layers).

Figure 2:
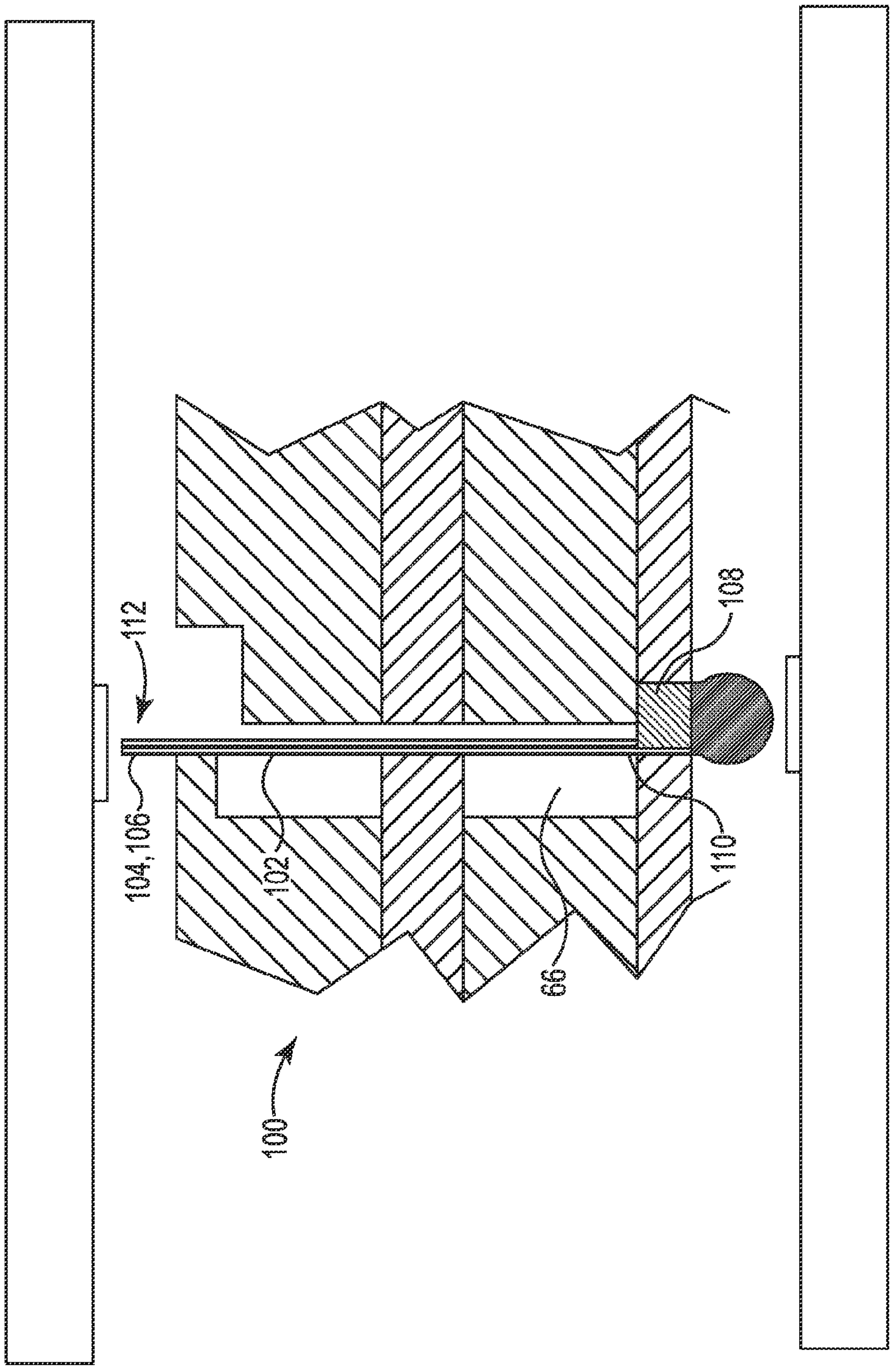
FIG. 2 is a cross-sectional view of an alternate electrical interconnect with multi-layered contact members in accordance with another embodiment of the present disclosure.
Figure 3:
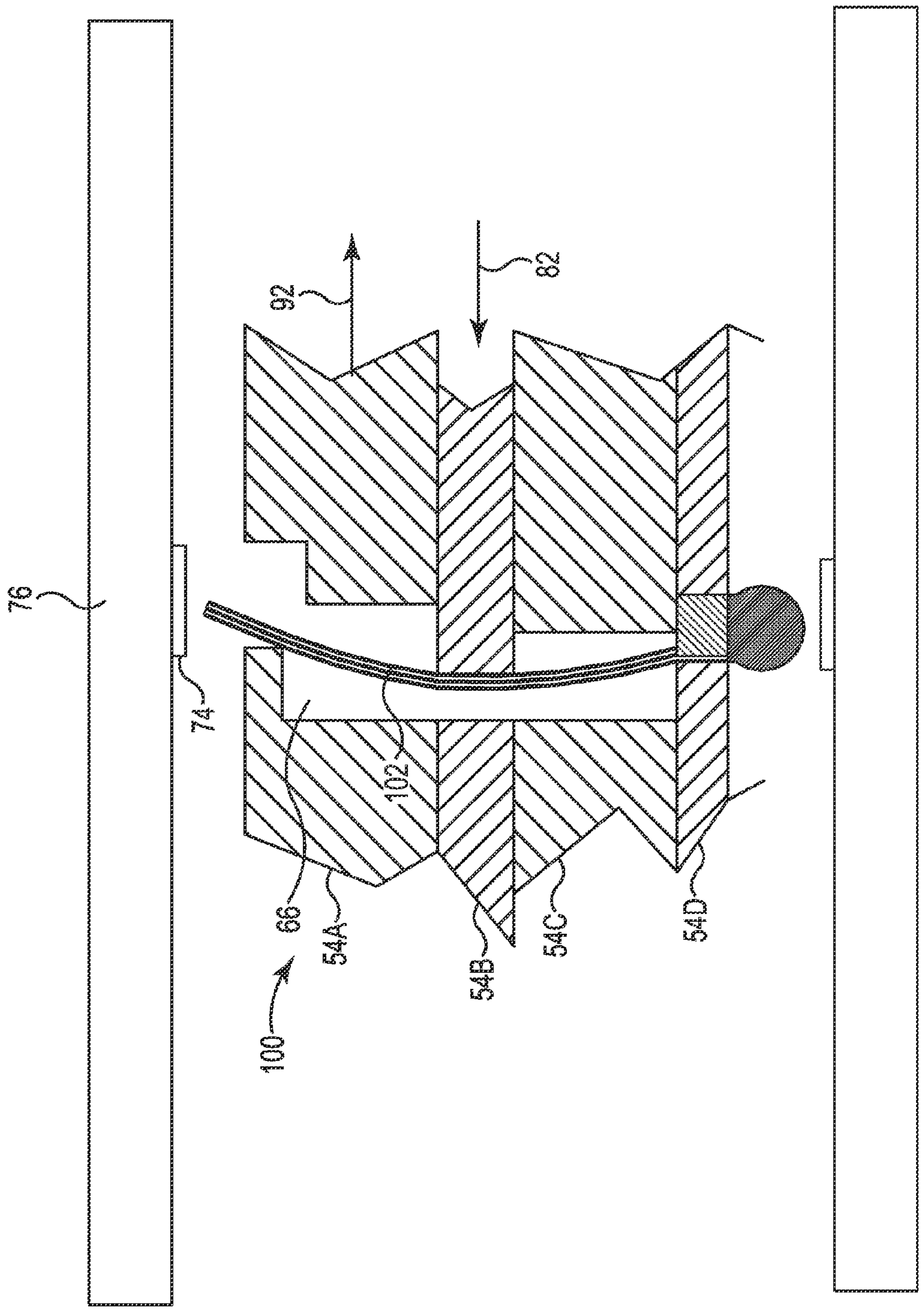
FIG. 3 is a cross-sectional view of the electrical interconnect of FIG. 2 in a translated position in accordance with another embodiment of the present disclosure.
Figure 4:
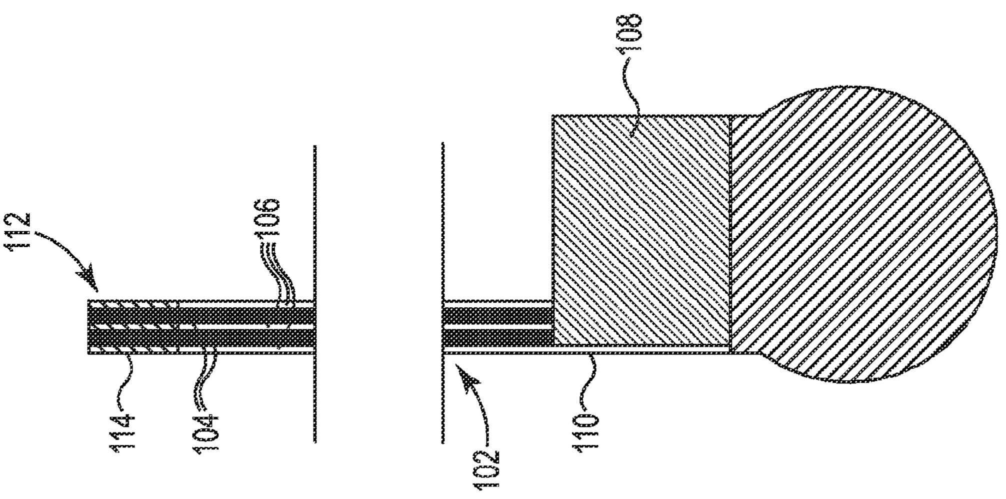
FIG. 4 is a cross-sectional view of a multi-layered contact member in accordance with another embodiment of the present disclosure.

FIGS. 2 and 3 illustrate an alternate electrical interconnect 100 with contact members 102 comprising multi-layered structures in accordance with an embodiment of the present disclosure. As best illustrated in FIG. 4, the contact members 102 include alternating layers of a conductive material 104, such as CuNiSi, and a dielectric material 106, such as LCP, Kapton, or a dielectric coating. The copper structure 108 is plated onto the proximal end 110 of the contact member 102 so the exposed edges and tips of the conductive material 104 are plated together. Omitting the shaped tip (see FIG. 1A) from the contact member 102 permits the size of the openings 66 to be reduced.

The substrate 52 is substantially as illustrated in FIG. 1A. As illustrated in FIG. 3, translating the layer 54B in direction 82 bows the contact member 102, as discussed above. In the illustrated embodiment, the layer 54A may also be translated in direction 92 to further deform the contact member 102. The displacement axes 82, 92 of the layers 54 are optionally parallel or non-parallel, depending on the shape of the contact member 102. Rotational displacement is also possible.

FIG. 4 is a detailed view of the contact member 102. In one embodiment, distal tip 112 is optionally plated 114 to electrically couple the conductive layers 104 and improve coupling with contact pad 74 on circuit member 76. In another embodiment, the dielectric material 106 is chemically or mechanically removed in region 112 to expose the conductive layers 104. Various multi-layered structures that are suitable for use as contact members are disclosed in PCT/US10/36295, filed May 27, 2010, and titled COMPOSITE POLYMER-METAL ELECTRICAL CONTACTS, the entire of disclosure of which is hereby incorporated by reference.

Figure 5A:
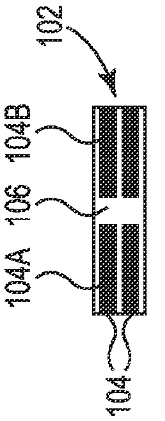
FIG. 5A is a cross-sectional view of a contact member in accordance with another embodiment of the present disclosure.
Figure 5B:
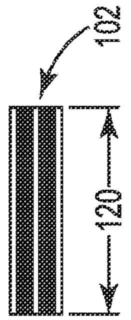
FIG. 5B is a cross-sectional view of an alternate contact member in accordance with another embodiment of the present disclosure.

FIGS. 5A and 5B are sectional views of alternate embodiments of the contact member 102 of FIG. 4. In the embodiment of FIG. 5A, the conductive layers 104 extend substantially the full width 120. In the embodiment of FIG. 5B, two discrete conductive segments 104A, 104B are in each layer 104, separated by dielectric material 106.

Figure 6:
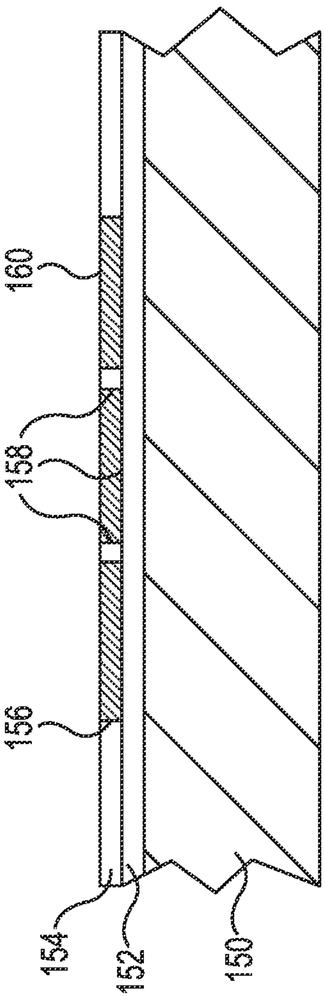
FIGS. 6 through 8 are cross-sectional views of a method of making a contact member for an electrical interconnect in accordance with another embodiment of the present disclosure.

FIG. 6 illustrates the principle of the present dielectric build up and metallization processes that may be used to create contact member in accordance with embodiments of the present disclosure. The nature of the process lends itself to creating vertical or 3-D like structure to simulate the principle of a rectangular or square cross section coax like construction.

The base substrate or flex material 150 is coated with liquid dielectric 152. The next liquid dielectric layer 154 is applied and imaged to create recesses 156. The sidewalls 158 of the recesses 156 are metalized, followed by bulk electroplating of a conductive material 160 to increase the copper thickness.

Figure 7:
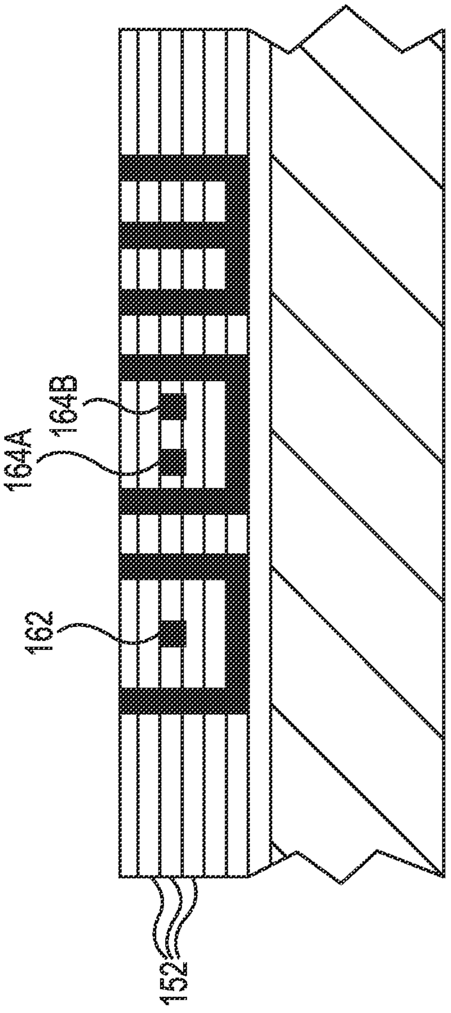
Figure 8:
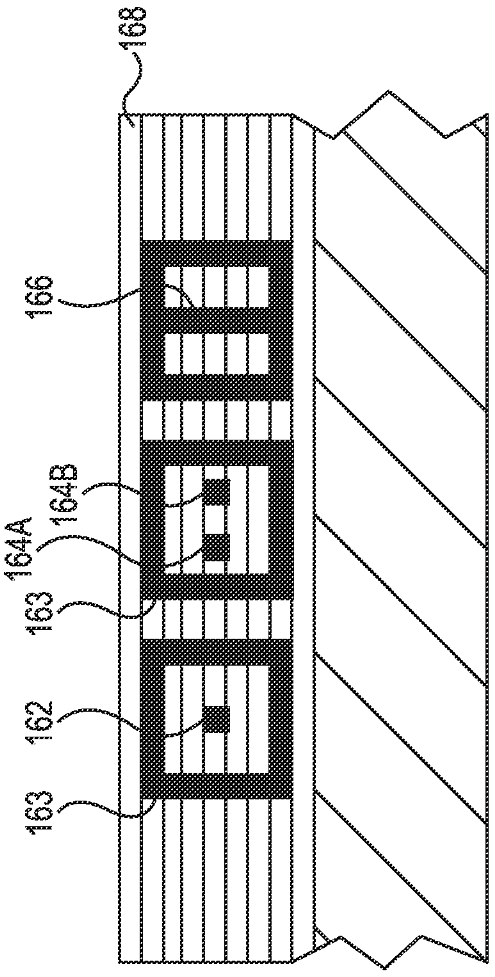

As illustrated in FIG. 7, subsequent layers of dielectric 152 are applied, imaged, selectively metalized, and bulk plated as discussed above. FIG. 8 illustrates center trace 162 providing a coaxial line surrounded by conductive material 163. Traces 164A, 164B are configured to provide twin axial lines, also surrounded by conductive material 163. The third structure is a coaxial/twin axial via structure 166 within the stack. The structures are preferably capped with a top layer of dielectric 168. The electrical structures 162, 164, 166 can be ganged together or singulated as discrete contact members.

The surfaces 158 of the dielectric layer 154 is preferably processed to promote electro-less copper plating using one or more of plasma treatment, permanganate, carbon treatment, impregnating copper nano-particles to activate the desired surfaces to promote electroplating. In the illustrated embodiment, the dielectric material 154 is processed to promote plating adhesion. Electro-less copper plating is applied to the recesses 156 to create conductive traces 160. Additional discussion of the use of electro-less plating of the dielectric structure is disclosed in PCT/US2012/53848, filed Sep. 6, 2012, titled DIRECT METALIZATION OF ELECTRICAL CIRCUIT STRUCTURES, the entire of disclosure of which is hereby incorporated by reference.

The present method permits the material between layers and within each layer to be varied. One aspect of the present process that differs from the traditional dry film build up process is the nature of the dielectric deposition in liquid form. The dielectric layers 154 can be applied by screen printing, stencil printing, jetting, flooding, spraying etc. The liquid material 154 flows and fills any recessed regions within a previous landscape. During the development process, desired regions remain and the regions that are not desired are washed away with fine resolution of the transition regions within the landscape. Multiple depositions steps can be tack cured and imaged such that thicker sections of dielectric 154 can be developed and washed away in one or multiple strip operations. As a result, internal cavities or mass regions can be excavated and subsequently filled at the next dielectric layer with materials that have physical properties differing from the base dielectric 152. In other words, the excavated regions can be filled or treated with materials that have a different dielectric constant, vary in conductive or mechanical or thermal properties to achieve a desired performance function not possible with a contiguous dry film technique.

In basic terms, the present process not only provides the ability to alter the material set and associated properties in a given layer, but the material set can be altered at any given point within a given deposition or layer. Additional disclosure on this process is set forth in PCT/US2013/030856, filed on Mar. 13, 2013, entitled HYBRID PRINTED CIRCUIT ASSEMBLY WITH LOW DENSITY MAIN CORE AND EMBEDDED HIGH DENSITY CIRCUIT REGIONS, which is hereby incorporated by reference.

The present process can also be used in combination with existing dry film techniques. For example, one or more of the layers can be a preformed dielectric film to leave air dielectric gaps between traces. Recesses in the dry film dielectric layer can be formed by printing, embossing, imprinting, laser cutting, chemical etching with a printed mask, or a variety of other techniques.

In one embodiment, a plating resist is the applied, imaged and developed to expose the recesses 156. Once the surfaces of the recesses 156 are plated, a higher deposition rate electroplate copper can be used to fill the recess 156 with conductive material to build up the conductive traces 160. The plating resist is then stripped.

The dielectric material 154 may include any of a number of materials that provide electrostatic dissipation or to reduce cross-talk between adjacent conductive traces 160. An efficient way to prevent electrostatic discharge ("ESD") is to construct one of the layers 152, 154 from materials that are not too conductive but that will slowly conduct static charges away. These materials preferably have resistivity values in the range of $10^5$ to $10^{11}$ Ohm-meters.

In one embodiment, the conductive traces 160 are formed by depositing a conductive material in a first state in the recesses 156 in the dielectric material, and then processed to create a second more permanent state. For example, the metallic powder is printed and subsequently sintered, or the curable conductive material flows into the recesses 106 and is subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source.

The recesses 156 permit control of the location, cross section, material content, and aspect ratio of the conductive traces 160. Maintaining the conductive traces 160 with a cross-section of 1:1 or greater provides greater signal integrity than traditional subtractive trace forming technologies. For example, traditional methods take a sheet of a given thickness and etch the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 156 to control the aspect ratio of the conductive traces 160 results in a more rectangular or square cross-section of the conductive traces 160, with the corresponding improvement in signal integrity.

The layered structure of the present contact members facilitates incorporation of various electrical devices in accordance with an embodiment of the present disclosure. The electrical devices can be added as discrete components or printed materials. The electrical devices can be a power plane, ground plane, capacitor, resistor, filters, signal or power altering and enhancing device, memory device, embedded IC, RF antennae, and the like. The electrical devices can be located on a surface of the contact members or be embedded within the layers 154. The electrical devices can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

The availability of printable silicon inks provides the ability to print electrical devices in the layers 154 of the contact members, such as disclosed in U.S. Pat. No. 7,485,345 (Renn et al.); U.S. Pat. No. 7,382,363 (Albert et al.); U.S. Pat. No.

7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

As described above, the contact members are preferably constructed of copper or similar metallic materials such as phosphor bronze or beryllium-copper. The contact members are preferably plated with a corrosion resistant metallic material such as nickel, gold, silver, palladium, or multiple layers thereof. In some embodiments the contact members are encapsulated except the distal and proximal ends. Examples of suitable encapsulating materials include Sylgard® available from Dow Corning Silicone of Midland, Mich. and Master Sil 713 available from Master Bond Silicone of Hackensack, N.J.

Figure 9:
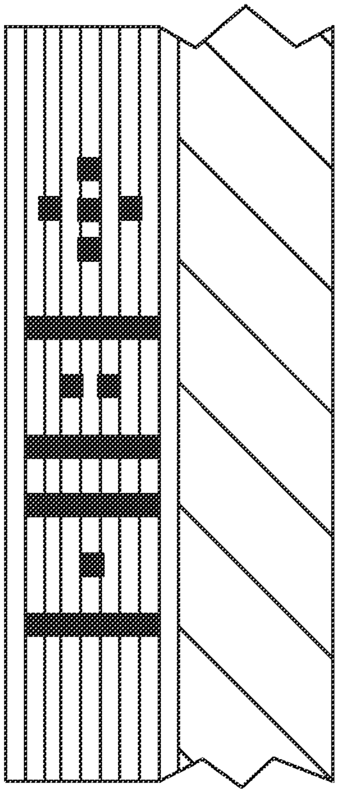
FIG. 9 is a cross-sectional view of an alternate contact member for an electrical interconnect in accordance with an embodiment of the present disclosure.

FIG. 9 illustrates contact members made as microstrips or using strip-line type principles with vertical walls or a conventional type transmission line turned onto its side. [Jim, can you add some further explanation to this structure? I assume we are looking at an end view so the conductive traces extend into the paper.]

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the invention. The upper and lower limits of these smaller ranges which may independently be included in the smaller ranges is also encompassed within the embodiments of the invention, subject to any specifically excluded limit in the stated range. Where the stated range includes one or both of the limits, ranges excluding either both of those included limits are also included in the embodiments of the invention.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and describe the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the invention are possible. Although the description above contains much specificity, these should not be construed as limiting the scope of the invention, but as merely providing illustrations of some of the presently preferred embodiments of this invention. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the invention. Thus, it is intended that the scope of the present disclosure herein disclosed should not be limited by the particular disclosed embodiments described above.

Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

What is claimed is:

1. A method of making an electrical interconnect comprising the steps of:

arranging a plurality of layers into a substrate with at least two adjacent layers configured to translate relative to each other between a nominal position and a translated position;

forming a plurality of through holes through the layers from a first surface of the substrate to a second surface of the substrate in both the nominal position and the translated position;

positioning at least one contact member in the through holes with distal portions accessible from the first surface of the substrate and a proximal portions positioned near the second surface;

securing the proximal portion of the contact members to the substrate near the second surface with a conductive structure; and translating the two adjacent layers of the substrate from the nominal position to the translated position to elastically deform the contact members within the through holes of the substrate and to displace the distal portions of the contact members toward the conductive structures, respectively.

2. The method of claim 1 comprising engaging the contact members with a plurality of inner walls in the translated position.

3. The method of claim 1 comprising engaging the contact members at three or more locations in the through holes when in the translated position.

4. The method of claim 1 comprising engaging protrusion on one of the layers with center portions of the contact members in the translated position.

5. The method of claim 1 comprising positioning the distal ends of the contact members above the first surface of the substrate in the nominal position.

6. The method of claim 1 comprising attaching solder balls to the conductive structures at locations above the second surface of the substrate.

7. The method of claim 1 comprising forming the contact members as a multi-layered structure of conductive and non-conductive materials.

8. The method of claim 7 comprising the steps of:

depositing a liquid dielectric on a substrate;

imaging a liquid dielectric to form at least one recess extending from the proximal end to the distal end of the substrate; and metalizing the recess to form a metalized layer.

9. The method of claim 8 comprising plating the metalized layer.

10. The method of claim 8 comprising configuring the recess and the metalized layer to comprises one of a coaxial line, a twin axial lines, or coaxial/twin axial via structure.

* * * * *